(12) United States Patent
Suzuki et al.

(10) Patent No.: US 7,042,283 B2
(45) Date of Patent: May 9, 2006

(54) HIGH-EFFICIENCY LINEAR POWER AMPLIFIER

(75) Inventors: Yasunori Suzuki, Yokohama (JP); Shinji Mizuta, Yokohama (JP); Tetsuo Hirota, Kanazawa (JP); Yasushi Yamao, Yokosuka (JP)

(73) Assignee: NTT BoCoMo, Inc., Tokyo (JP)

( * ) Notice: Subject to any disclaimer, the term of this patent is extended or adjusted under 35 U.S.C. 154(b) by 77 days.

(21) Appl. No.: 10/806,245

(22) Filed: Mar. 23, 2004

(65) Prior Publication Data

US 2004/0189378 A1 Sep. 30, 2004

(30) Foreign Application Priority Data

Mar. 24, 2003 (JP) ............................. 2003-079283

(51) Int. Cl.
   *H03F 3/66* (2006.01)
(52) U.S. Cl. ..................................... 330/52; 330/124 R
(58) Field of Classification Search ..................... None
   See application file for complete search history.

(56) References Cited

U.S. PATENT DOCUMENTS

| | | | |
|---|---|---|---|
| 5,880,633 A | 3/1999 | Leizerovich et al. | 330/84 |
| 6,356,146 B1 | 3/2002 | Wright et al. | 330/2 |
| 6,472,934 B1 | 10/2002 | Pehlke | 330/10 |
| 6,549,067 B1 | 4/2003 | Kenington | 330/52 |
| 2004/0116083 A1* | 6/2004 | Suzuki et al. | 455/126 |

FOREIGN PATENT DOCUMENTS

| | | |
|---|---|---|
| CN | 1126391 | 7/1996 |
| CN | 1349679 | 5/2002 |
| EP | 0 665 661 A2 | 8/1995 |
| EP | 1 104 093 A1 | 5/2001 |
| JP | 2000-286645 | 10/2000 |
| WO | WO 01/95480 A1 | 12/2001 |

OTHER PUBLICATIONS

W. H. Doherty, "A New High Efficiency Power Amplifier for Modulated Waves", Proceedings of the Institute of Radio Engineers, Technical Papers; vol. 24, No. 9, Sep. 1936, pp. 1163-1182.

* cited by examiner

*Primary Examiner*—Robert Pascal
*Assistant Examiner*—Krista M. Flanagan
(74) *Attorney, Agent, or Firm*—Oblon, Spivak, McClelland, Maier & Neustadt, P.C.

(57) ABSTRACT

A transmission signal and a pilot signal are predistorted by a digital predistorter 13 by use of a power-series model, and the predistorted output is converted by a digital-analog converter 14 to an analog signal. The analog signal is up converted by a frequency converter 15 to an RF-band signal, which is transmitted after being power-amplified by a Doherty amplifier 16. The pilot signal is extracted by a pilot signal extractor 17 from the output from the Doherty amplifier, and the extracted pilot signal is down converted by a frequency converter 18 to a baseband signal. The baseband pilot signal is converted by an analog-digital converter 19 to a digital pilot signal. A control part 21 detects an odd-order distortion component from the digital pilot signal, and based on the detected result, controls parameters of the digital predistorter.

10 Claims, 10 Drawing Sheets

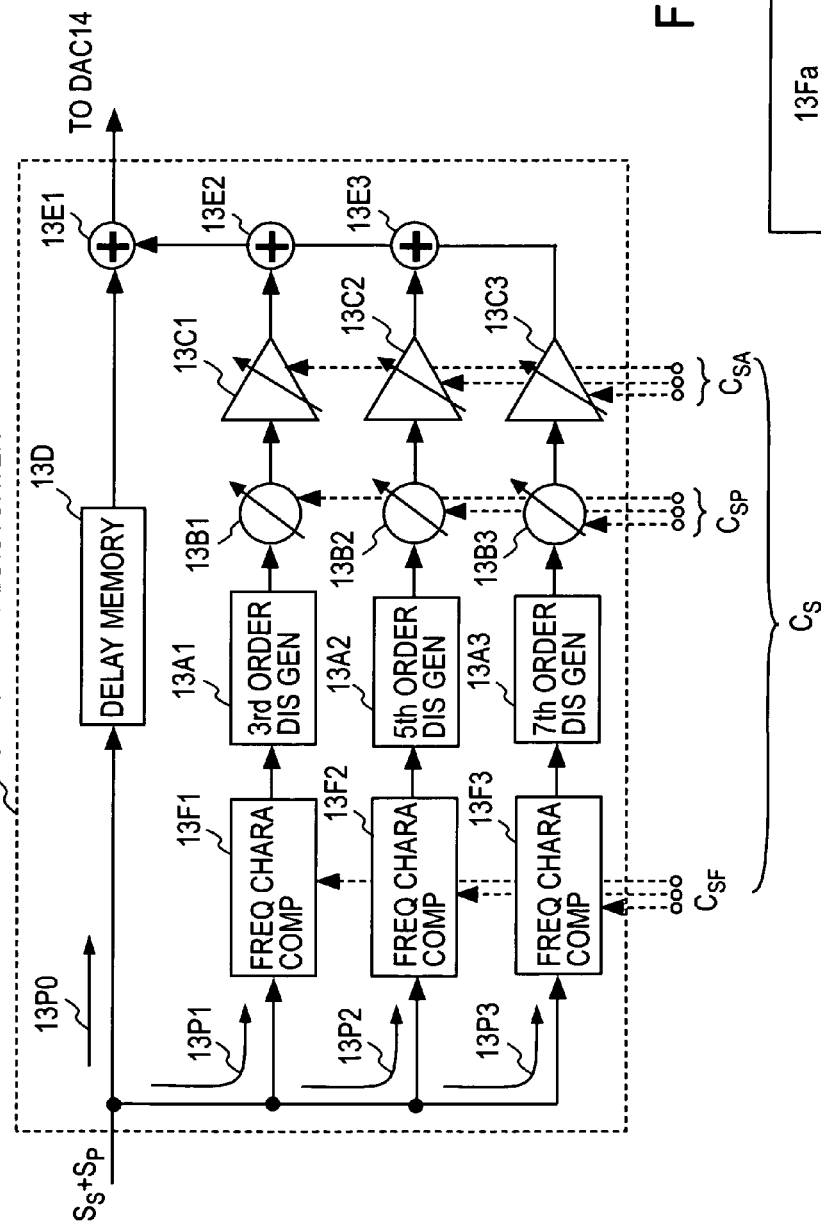
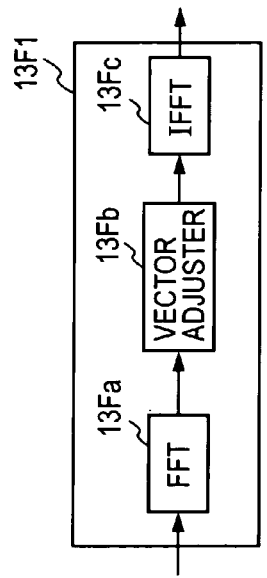
FIG. 5A
FIG. 5B

HIGH-EFFICIENCY LINEAR POWER AMPLIFIER

TECHNICAL FIELD

The present invention relates to a high-efficiency linear power amplifier provided with a digital predistorter and a Doherty amplifier for use in radio communication transmitters.

PRIOR ART

There is known a Doherty amplifier that is a combination of amplifiers of different operating points (W. H. Doherty, "A new high efficiency power amplifier for modulated waves," processing of the IRE, Vol. 24, no. 9, pp. 1163–1182, 1936). A basic configuration of the Doherty amplifier is shown in FIG. 1, which is a parallel connection of a series connection of a quarter-wavelength line 5 and a peak amplifier 6 and a series connection of a carrier amplifier 7 and a quarter-wavelength line 8. The peak amplifier 6 has set therein a threshold value of amplitude for an input modulated wave signal and a bias operating point set for the class "C" operation for an input signal of amplitude exceeding the threshold value. The carrier amplifier 7 has set therein a bias operating point to perform the class "B" operation at all times. When the amplitude of the input modulated wave signal is below the threshold value, the output signal from the carrier amplifier 7 is provided as the output signal from the Doherty amplifier. When the amplitude of the input modulated wave signal is in excess of the threshold value, the sum of output signals from the carrier amplifier 7 and the peak amplifier 6 is provided as the output signal from the Doherty amplifier.

By the injection of a signal component by the peak amplifier 6 when the amplitude of the input signal exceeds the threshold value, the saturated output power from the Doherty amplifier expands corresponding to the injected signal component. This expansion of the saturation output power produces an effect of compressing the output backoff more than in the case of an amplifier of the same the saturation output power as that of the Doherty amplifier. For example, an efficiency of x % at a 1-dB gain compression point of a Doherty amplifier capable of 3-dB output backoff compression corresponds to a 0-dB output backoff of a conventional amplifier. Thus, the Doherty amplifier permits high-efficiency amplification.

Nowadays, mobile communication systems employ a linear modulation scheme, and transmitting amplifiers for mobile communications are required to perform linear amplification. Furthermore, equipment miniaturization calls for high-efficiency amplification that reduce power consumption requirements. The Doherty amplifier that achieves the high-efficiency amplification is effective in reducing the power consumption of transmitters for mobile communications.

Because of the parallel connection of two amplifiers of different operating points, the Doherty amplifier suffers degradation of linearity corresponding to the amount of output backoff compression as compared with a conventional class "A" or class "AB" amplifier. Further, the peak amplifier of the Doherty amplifier operates only in a region higher than a 1-dB gain compression point of a carrier amplifier. On this account, an amplifier design by the output backoff scheme encounters difficulty in achieving predetermined linear amplification in the region of transmitting output power in which to perform high-efficiency amplification. Accordingly, it is essential to construct a Doherty amplifier equipped with a nonlinear distortion compensating function that strongly suppresses the nonlinear distortion in the vicinity of the 1-dB gain compression point.

The inventors of this application had proposed a feedforward amplifier configuration that applied the Doherty amplifier to the main amplifier (for example, Japanese Patent Application Kokai Publication Gazette No. 2000-286645). Leizerovich et al. had proposed a combination of the Doherty amplifier and a Cartesian feedback structure (for example, U.S. Pat. No. 5,880,633). These configurations are newly added with a linearizing circuit so as to make effective use of the high-efficiency amplification by the Doherty amplifier.

The feedforward amplifier using the Doherty amplifier as the main amplifier has an auxiliary amplifier, and hence it cannot fully utilize high efficiency possible with the output backoff compression of the Doherty amplifier. With the configuration using the Cartesian feedback scheme, since stable automatic control calls for a bandwidth at least more than four times that of the modulated wave, it is necessary to achieve distortion compensation over a wide band. Thus, there has been a demand for a configuration that permits high-efficiency amplification while at the same time achieving predetermined linearity. Further, from the viewpoint of configuration, it is desirable that the amplifier be as simple as possible.

To achieve predetermined linearity, the output backoff of the power amplifier is determined taking into account a crest factor of the modulation scheme used. To further increase the efficiency of the power amplifier, the amplifier configuration needs to minimize the output backoff. Up to now, it has been desired to clarify a linearizing circuit configuration capable of effectively utilizing the output backoff compression effect by the Doherty amplifier.

SUMMARY OF THE INVENTION

It is therefore an object of the present invention to provide a high-efficiency linear power amplifier that permits high-efficiency power amplification while achieving predetermined linearity.

The high-efficiency linear power amplifier according to the present invention comprises:

a digital predistorter for predistorting an input digital transmission signal thereto by use of a power-series model;

a digital-analog converter for converting the output from said digital predistorter to an analog signal;

an up converting part for frequency-converting the output signal from said digital-analog converter to a signal of the radio frequency band; and a Doherty amplifier for power-amplifying said radio frequency band signal and for transmitting the power-amplified signal.

BRIEF DESCRIPTION OF THE DRAWINGS

FIG. 5A is a block diagram depicting another example of the digital predistorter for use in the high-efficiency linear power amplifier according to the present invention;

FIG. 5B is a block diagram showing an example of a frequency characteristic compensator;

DETAILED DESCRIPTION OF THE PREFERRED EMBODIMENTS

High-Efficiency Linear Power Amplifier

Figure 2:
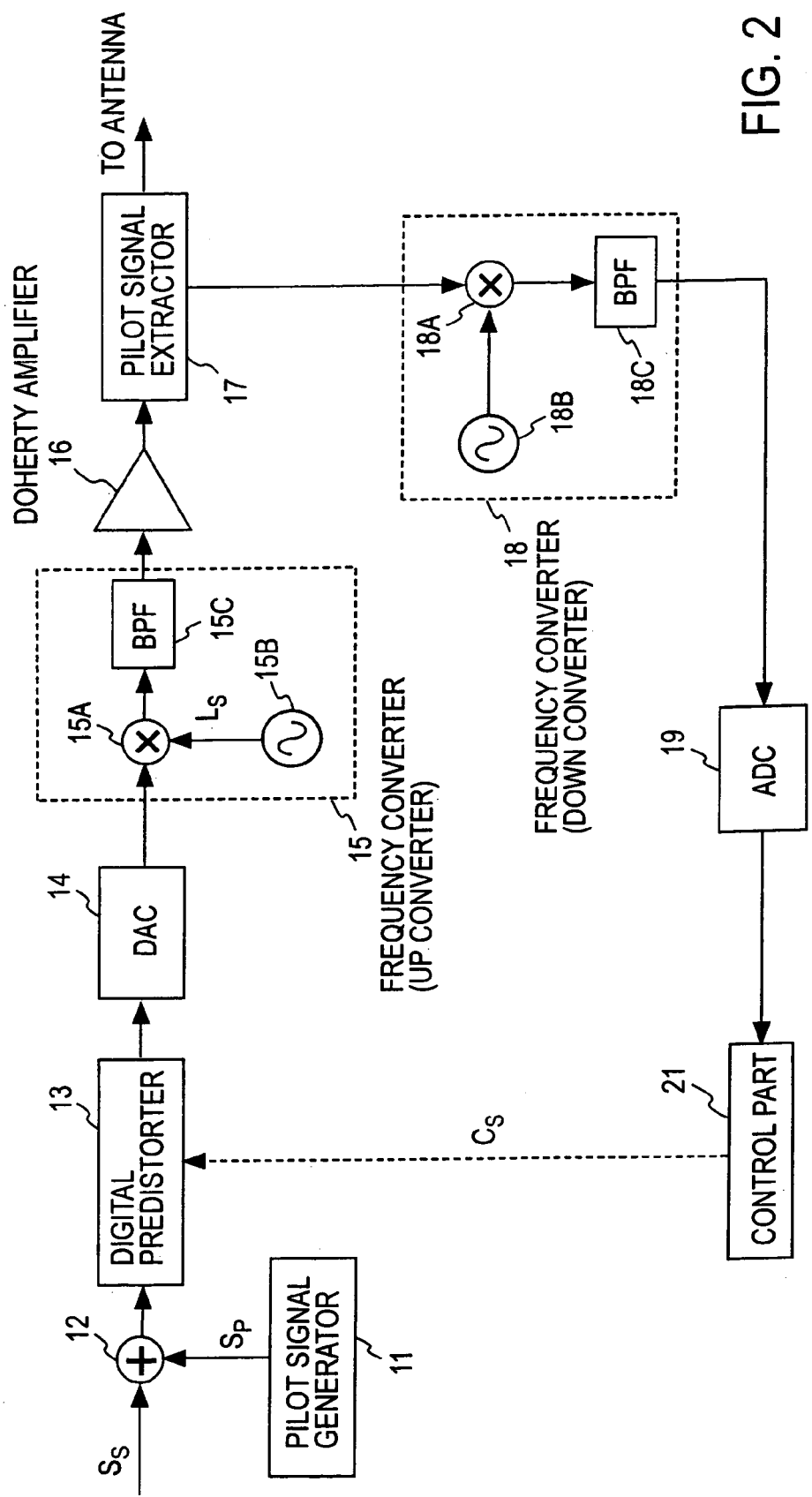
FIG. 2 is a block diagram illustrating an embodiment of the high-efficiency linear power amplifier according to the present invention.

FIG. 2 illustrates an embodiment of the high-efficiency linear amplifier according to the present invention.

Figure 1:
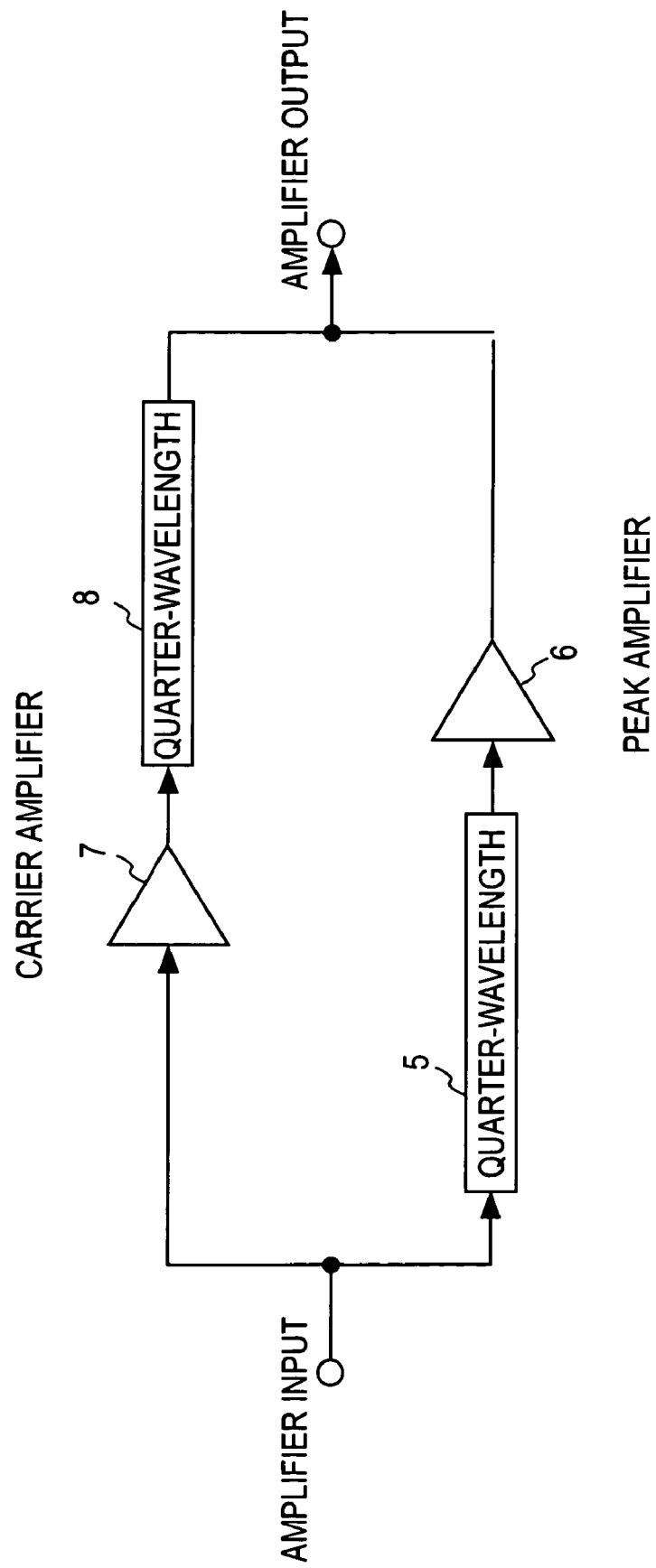
FIG. 1 is a diagram showing a basic configuration of a conventional Doherty amplifier.

The high-efficiency linear power amplifier according to this embodiment comprises: a pilot signal generator 11, an adder 12 for adding a transmission signal $S_S$ and a pilot signal $S_P$; a digital predistorter 13; a digital-analog converter (DAC) 14 for converting a predistorted signal to an analog signal; a frequency converter (up converter) composed of a mixer 15A, a local oscillator 15B and a band-pass filter (BPF) 15C; a Doherty amplifier 16; a pilot signal extractor 17 for extracting the pilot signal; a frequency converter (down converter) 18 composed of a mixer 18A, a local oscillator 18B and a band-pass filter (BPF) 18C, for frequency-converting the extracted pilot signal to the base band signal; an analog-digital converter (ADC) 19 for converting the output signal from the frequency converter 18 to digital form; and a control part 21 for controlling the digital predistorter 13. Assume that the Doherty amplifier 16 has a peak amplifier and a carrier amplifier as is the case with the Doherty amplifier depicted in FIG. 1, for instance.

In the FIG. 2 embodiment and other embodiments described below, let it be assumed that the transmission signal $S_S$ and the pilot signal $S_P$ are both digital signals. The pilot signal generator 11 generates, as the pilot signal $S_P$, two continuous wave signals (also called tone signals) of the same amplitude but of different frequencies. The pilot signal $S_P$ is added by the adder 12 with the transmission signal $S_S$, and the added output is provided to the digital predistorter 13. The digital predistorter 13 predistorts the transmission signal $S_S$ and the pilot signal $S_P$ added together. The output signal from the digital predistorter 13 is converted by the digital-analog converter 14 to analog signal. The output signal from the digital-analog converter 14 is applied to the frequency converter 15, wherein it is frequency-mixed by the mixer 15A with a local signal $L_S$ from the local oscillator 15B, and the transmission signal $S_S$ and the pilot signal $S_P$ both up converted to the predetermined radio frequency band (RF band) are taken out by the band-pass filter 15C. The transmission signal $S_S$ and the pilot signal $S_P$ in the RF band are power-amplified by the Doherty amplifier 16. A preamplifier or the like may be inserted in the line from the digital-analog converter 14 to the Doherty amplifier 14 at an arbitrary position.

The pilot signal extractor 17 extracts the pilot signal (containing only an odd-order distortion component) from the radio-frequency signal (RF signal) from the Doherty amplifier 16 and supplies the RF signal to an antenna (not shown). In the case where the transmission signal $S_S$ and the pilot signal $S_P$ are set at different frequencies, the pilot signal extractor 17 is constituted by a directional coupler or power divider, and a band-pass filter that includes in its pass band the frequency of the pilot signal frequency-converted to the RF band. The RF band pilot signal extracted by the extractor 17 is applied to the frequency converter 18, wherein it is frequency-mixed by the mixer 18A with a local signal from the local signal oscillator 18B and frequency-converted to a baseband pilot signal, which is taken out by the band-pass filter 18C. The baseband-converted pilot signal is converted by the analog-digital signal to digital form. In the control part 21 an odd-order distortion component contained in the digitized pilot signal, generated by the Doherty amplifier 16, is used as a control signal $C_S$ to control the parameter of the signal predistorter 13 to minimize the odd-order distortion component level of the pilot signal.

The frequency spacing between the two tone signals forming the pilot signal $S_P$ is, for example, several hundred Hz or below, and hence the bandwidth of pilot signal $S_P$ is sufficiently narrower than the bandwidth of the transmission signal $S_S$. By using the tone signals to form the pilot signal, it is possible to reduce the response speed of negative feedback that has been a problem in the conventional digital predistortion scheme and Cartesian feedback control scheme, so that distortion control can be effected with high accuracy. Since distortion compensation can be made with higher accuracy in the output power in the vicinity of the 1-dB gain compression point, it is possible to strongly suppress distortion in this region. As compared with a traditional lookup table type digital predistorter, the digital predistorter in this embodiment is simple-structured since no memory for the lookup table is needed. As described above, it is possible to simply and accurately suppress the nonlinear distortion in the output power region in which the peak power amplifier of the Doherty amplifier operates.

In this way, linear amplification can be achieved in the transmitting output power region in which the peak amplifier of the Doherty amplifier operates. The amplifier configuration of this embodiment permits high-efficiency linear amplification.

Figure 3:
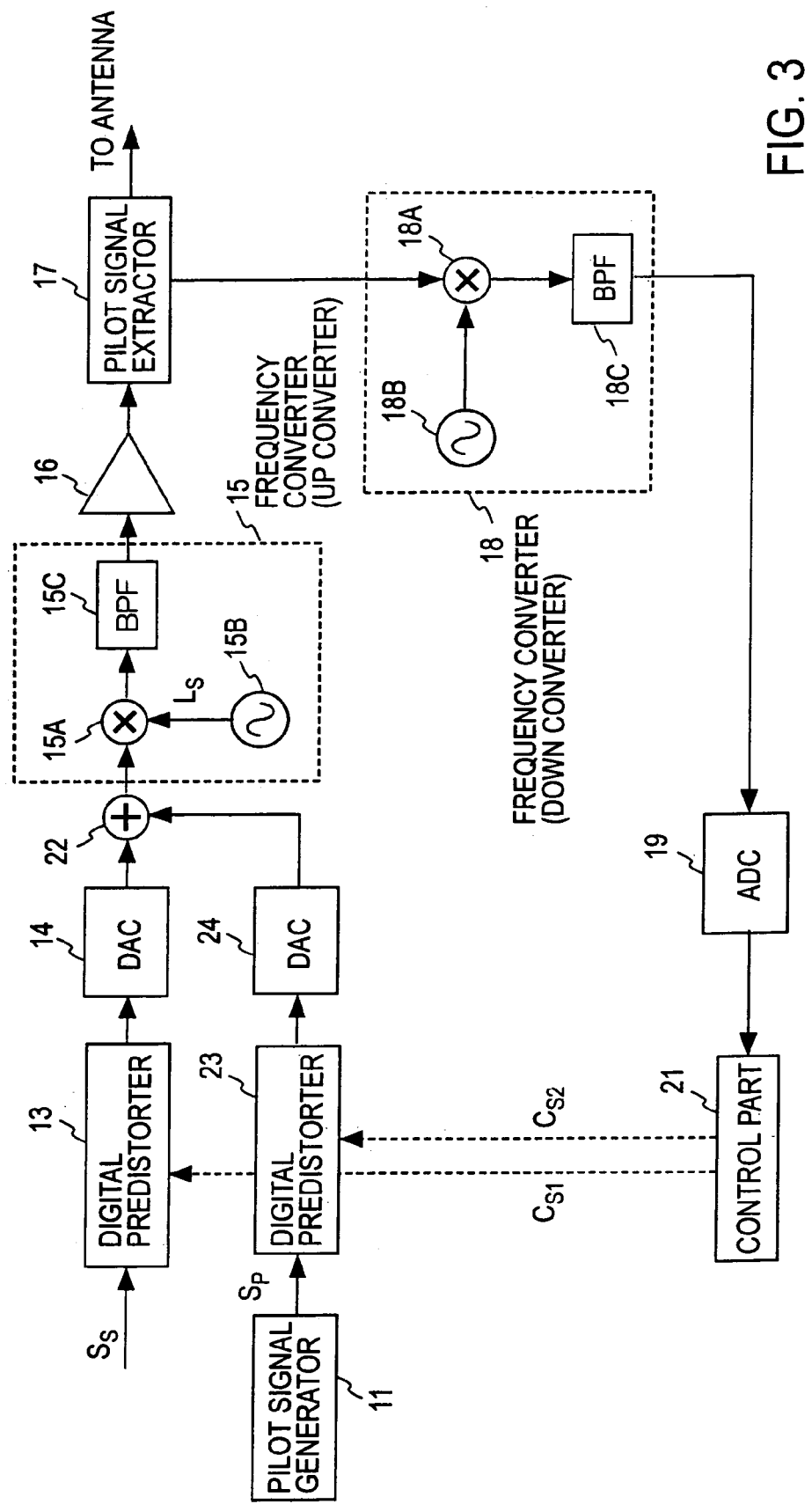
FIG. 3 is a block diagram illustrating another embodiment of the high-efficiency linear power amplifier according to the present invention.

FIG. 3 illustrates a second embodiment of the high-efficiency linear power amplifier according to the present invention.

In this embodiment, the pilot signal $S_P$ and the transmission signal $S_S$ are predistorted separately by different digital predistorters 13 and 23, then converted by different digital-analog converters 14 and 24 to analog signals, which are added together by an adder 22, and the added output is applied to the frequency converter 15. The control of the digital predistorters 13 and 23 after extraction of the pilot signal is effected synchronously by the control signals $C_{S1}$ and $C_{S2}$. Since embodiment is common in construction and in operation to the FIG. 2 embodiment except the above, no description will be repeated. The second embodiment allows the use of a digital-analog converter of low conversion speed.

The first embodiment of FIG. 2 has been described as being configured to perform simultaneous digital-analog conversion of the transmission signal and the pilot signal by the same digital-analog converter 14. In this instance, the operating speed of the digital-analog converter 14 needs to be high enough to effect predetermined over-sampling of the sum of the transmission signal bandwidth and the bandwidth of the pilot signal that is injected outside it. To meet this requirement, the digital-analog converter used is expensive accordingly. The second embodiment is effective when sufficient over-sampling is impossible with the configuration of the first embodiment.

Digital Predistorter

Figure 4:
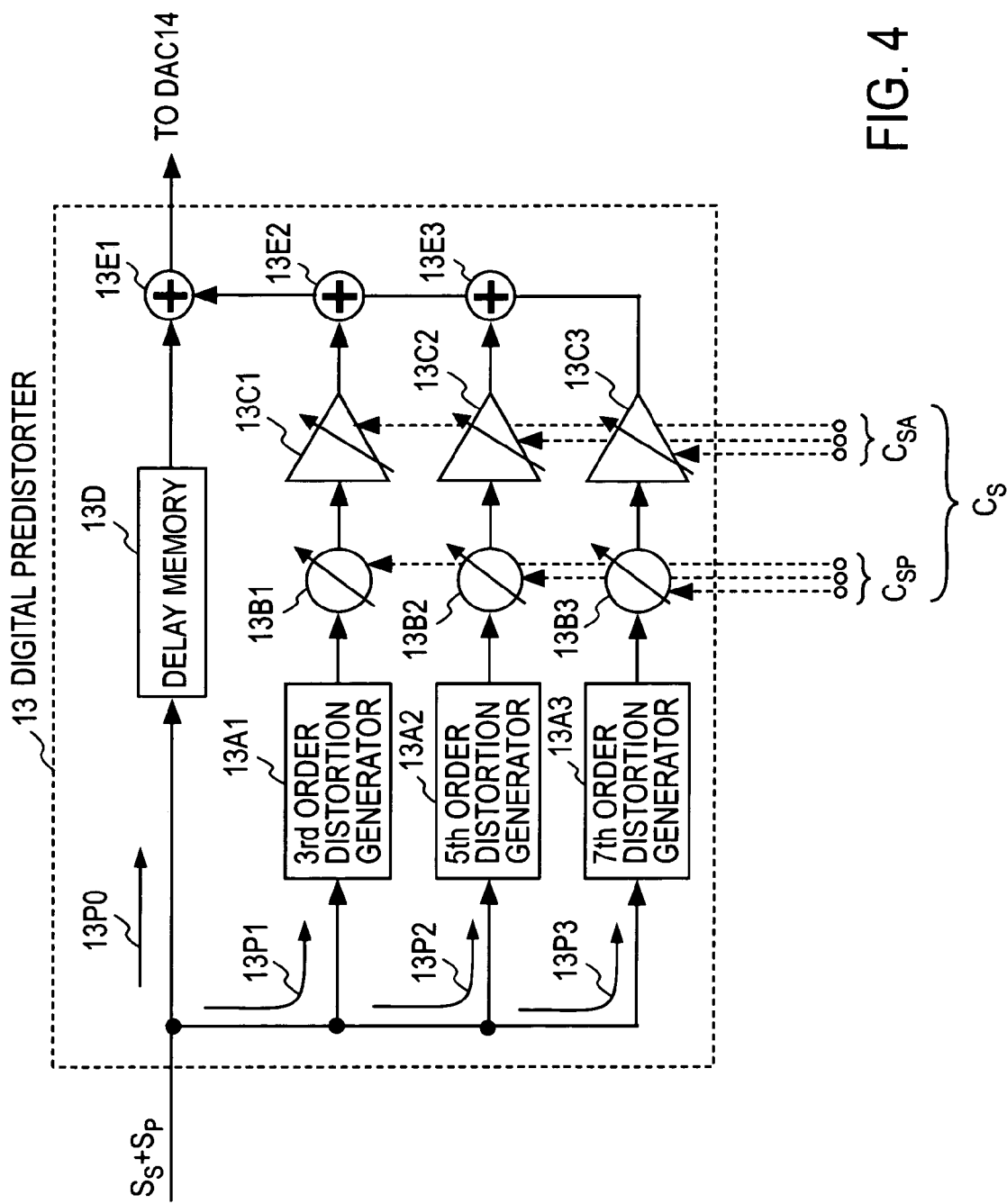
FIG. 4 is a block diagram depicting an example of a digital predistorter for use in the high-efficiency linear power amplifier according to the present invention.

FIG. 4 illustrates an example of the digital predistorter 13 used in the embodiments of FIGS. 2 and 3.

The digital predistorter depicted in FIG. 4 is configured using a power-series model, and has a linear path 13P0 for linear transfer of an input signal and a plurality of nonlinear paths 13P1, 13P2 and 13P3 for generating odd-order distortion components of the input signal. In the linear path 13P0 there is inserted a delay memory 13D for delaying the input signal by the same time interval as in the nonlinear path. The nonlinear paths for providing odd-order distortion components are, in this example, three nonlinear paths 13P1, 13P2 and 13P3 for generating third-order, fifth-order and seventh-order distortion components, respectively. The nonlinear paths are each formed by one of series connections of odd-order distortion generators 13A1, 13A2, 13A3, variable phase shifters for phase control 13B1, 13B2, 13B3, and variable gain controllers for amplitude control 13C1, 13C2, 13C3. The outputs from the nonlinear paths 13P1, 13P2 and 13P3 for generating the third- fifth- and seventh-order distortion components are added together by adders 13E2 and 13E3, then the added outputs are added by an adder 13E1 with the output from the linear path 13P0, and the added output is input as the output from the digital predistorter 13 to the digital-analog converter 14. The variable phase shifter and the variable gain controller may combined into a vector controller. The variable phase shifters 13B1, 13B2, 13B3 and the variable gain controllers 13C1, 13C2, 13C3 are controlled by a control signal $C_S$ ($C_{SP}$, $C_{SA}$) from the control part 21. The digital predistorter 23 in FIG. 3 can be similarly configured.

FIG. 5A illustrates in block form another example of the digital predistorter 13.

The illustrated digital predistorter 13 is configured to compensate for the frequency dependent distortion of the power amplifier 16 in FIG. 2 or 3. With an increase in the band of the transmission signal, it becomes more and more difficult to uniformly suppress distortion components produced by the power amplifier over the wide band. The frequency characteristic of the distortion components by the power amplifier depend on the nonlinear characteristic at its input or output side, in the case of FET, such frequency characteristic as gate-source capacitance, transconductance, drain conductance and so forth. A translation table of a conventional lookup table type digital predistorter sets therein data on a particular frequency only. In contrast thereto, the digital predistorter of this embodiment has frequency characteristic compensators 13F1, 13F2 and 13F3 at the input sides of the odd-order distortion generators 13A1, 13A2 and 13A3. The frequency characteristic compensators 13F1, 13F2 and 13F3 are each formed by an FIR filter, for instance, and the frequency characteristic can be adjusted by controlling filter coefficients by control signals $C_{SF}$. Alternatively, the frequency characteristic compensator may be formed by a series connection of a fast Fourier transformer (FFT) 13Fa, a vector adjuster 13Fb and an inverse fast Fourier transformer (IFFT) 13Fc as depicted in FIG. 5B. In the case of FIG. 5B, the added signal of the transmission signal and the pilot signal is transformed by FFT 13Fa to a frequency domain signal, then the amplitude and phase of the frequency domain signal (spectrum) are adjusted by the vector adjuster 13Fb, and the adjusted spectrum is transformed by IFFT 13Fc to a time domain signal, which is applied to the third-order distortion generator 13A1.

The other frequency characteristic compensators 13F2 and 13F3 can similarly be formed.

As described above, it is possible to impart arbitrary frequency characteristic to each odd-order distortion component by controlling the FIR filter coefficients or coefficients of the vector adjuster 13Fb. In the FIG. 5 embodiment, the provision of the frequency characteristic compensators 13F1, 13F2 and 13F3 at the input sides of the odd-order distortion generators 13A1, 13A2 and 13A3 is particularly suitable to adopt when the frequency characteristic of the intermodulation distortion produced by the power amplifier 16 depend mainly on the frequency characteristic of the distortion component at the input side of the power amplifier 16.

Figure 6:
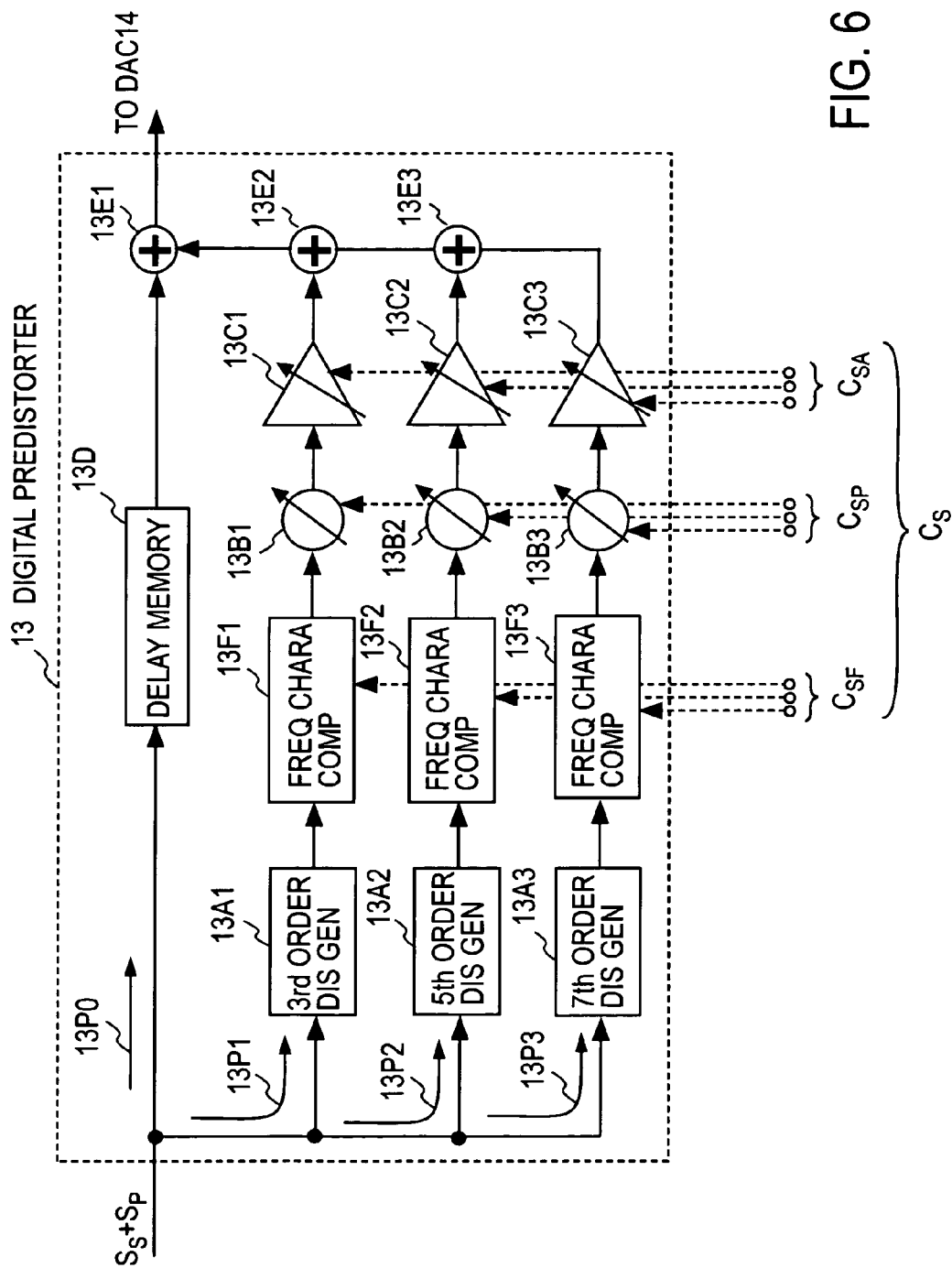
FIG. 6 is a block diagram depicting another example of the digital predistorter for use in the high-efficiency linear power amplifier according to the present invention.

FIG. 6 illustrates in block form another example of the digital predistorter 13. In this example the frequency characteristic compensators 13F1, 13F2 and 13F3 in the FIG. 5A embodiment are placed at the output sides of the odd-order distortion generators 13A1, 13A2 and 13A3, respectively. The configuration of the FIG. 6 embodiment is suitable for use when the frequency characteristic of the intermodulation distortion produced by the power amplifier 16 depend mainly on the frequency characteristic of the distortion component at the output side of the power amplifier 16. The frequency characteristic compensators 13F1, 13F2 and 13F3 are identical in construction with those in the FIG. 5A embodiment.

Figure 7:
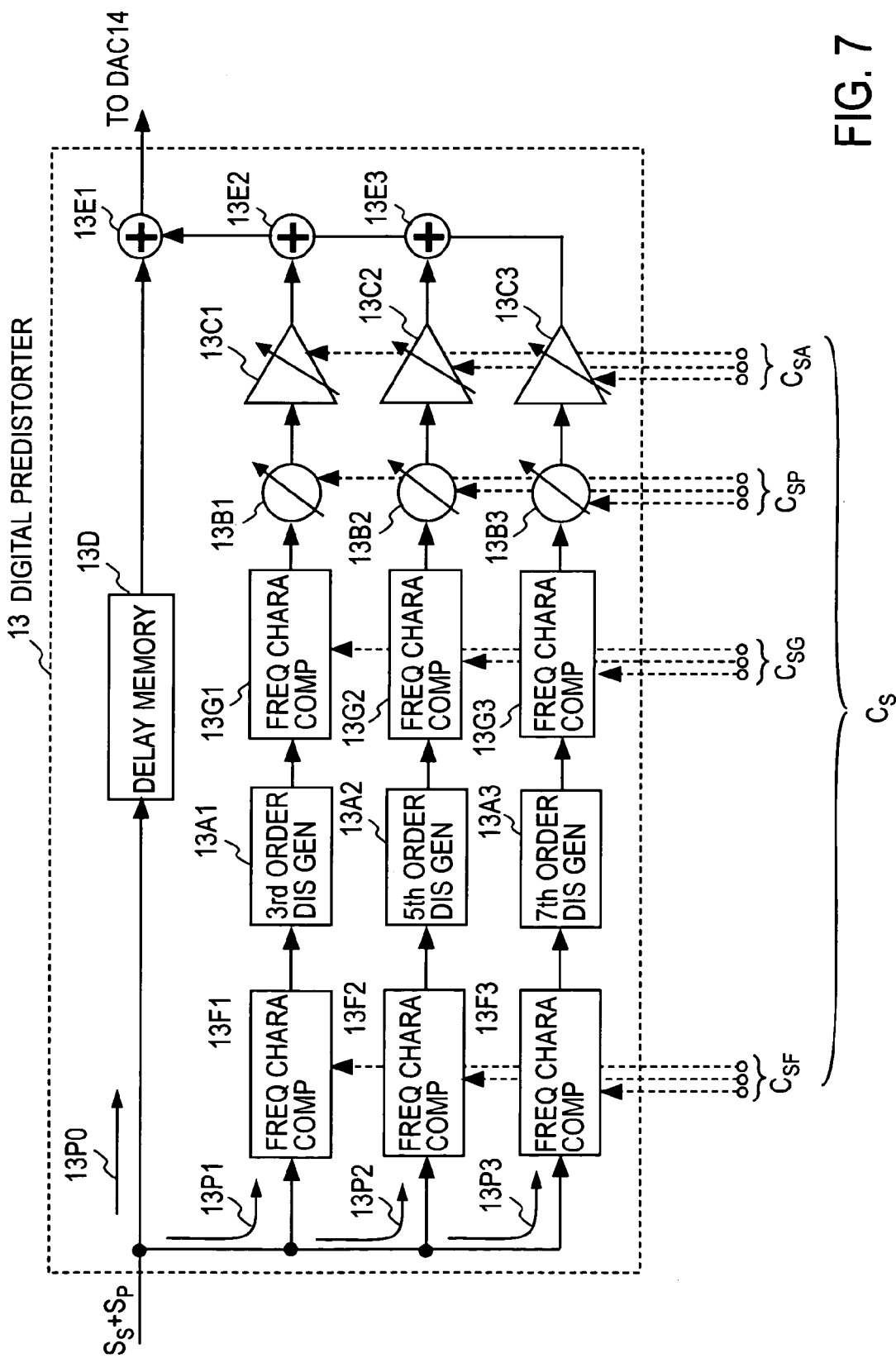
FIG. 7 is a block diagram depicting still another example of the digital predistorter for use in the high-efficiency linear power amplifier according to the present invention.

FIG. 7 illustrates in block form still another embodiment of the digital predistorter.

This example is a combination of the embodiments of FIGS. 5A and 6. The frequency characteristic compensators 13F1, 13F2 and 13F3 are placed at the input sides of the odd-order distortion generators 13A1, 13A2 and 13A3, at the output sides of which are also placed frequency characteristic compensators 13G1, 13G2 and 13G3, respectively whose frequency characteristics are controlled by control signals $C_{SG}$. This embodiment is common in construction to the FIG. 5A or 6 embodiment except the above. The configuration of the FIG. 7 embodiment is suitable for use when the frequency characteristic of the intermodulation distortion by the power amplifier 16 in FIGS. 2 and 3 depend mainly on the frequency characteristic of the distortion component at both of the input and output side of the power amplifier 16. The respective frequency characteristic compensators are identical in construction with those in the embodiment of FIG. 5A.

Control Part

Figure 8:
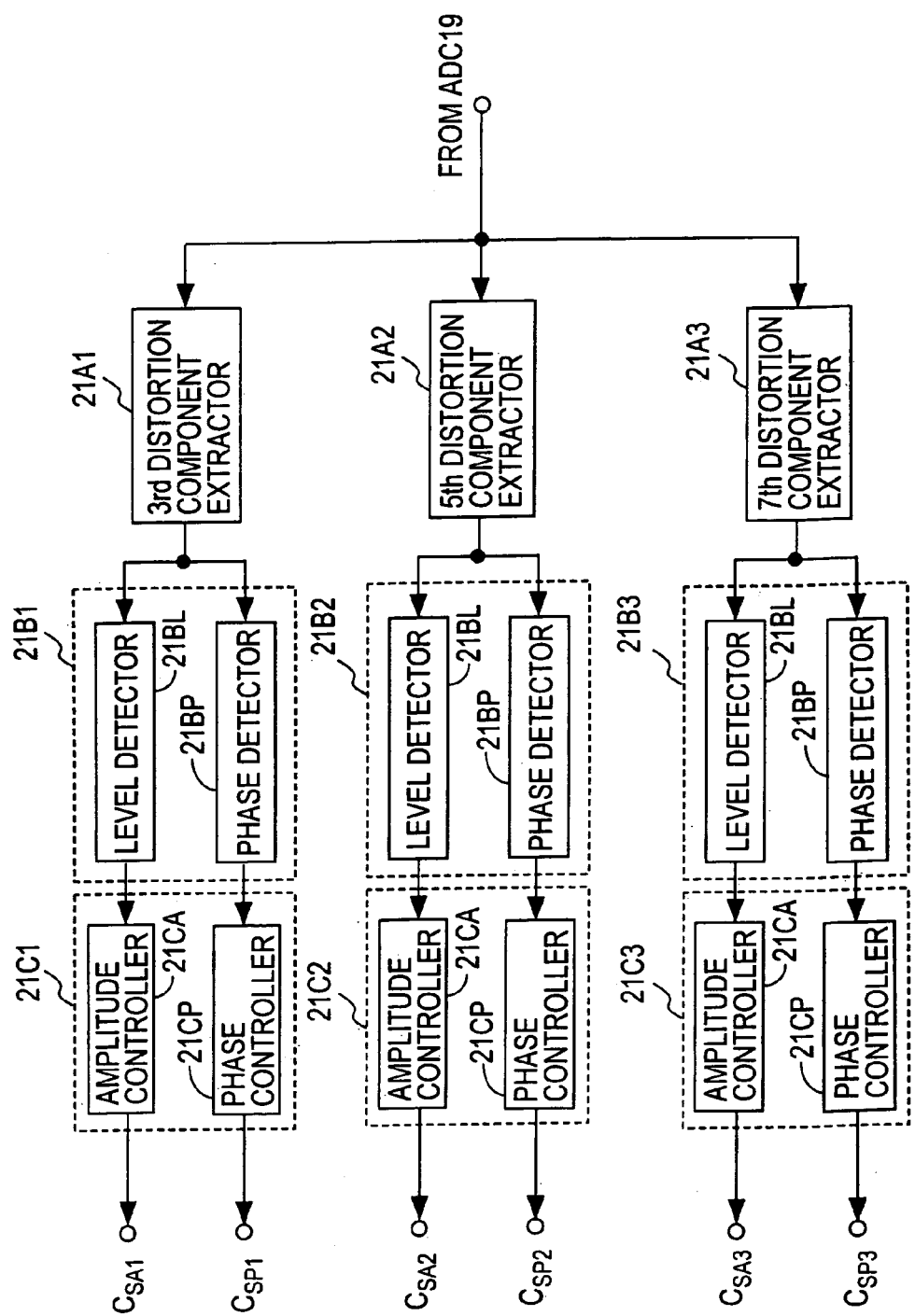
FIG. 8 is a block diagram showing an example of a control part for use in the high-efficiency linear power amplifier according to the present invention.

FIG. 8 illustrates an embodiment of the control part 21 in FIGS. 2 and 3. This embodiment is directed to control of a detector that detects each distortion component after extraction of the pilot signal. The control part 21 is made up of third-, fifth- and seventh-order distortion component extracting parts 21A1, 21A2, 21A3, and distortion component detecting parts 21B1, 21B2, 21B3 and amplitude/phase controllers 21C1, 21C2, 21C3 provided corresponding to the respective odd orders. The distortion component detecting parts 21B1, 21B2 and 21B3 each have a level detector 21BL for detecting the level of the extracted distortion component, and a phase detector 12BP for detecting the phase of the distortion component. The amplitude/phase controllers 21C1, 21C2 and 21C3 have: amplitude controllers 21CA that generate odd-order component amplitude control signals $C_{SA1}$, $C_{SA2}$ and $C_{SA3}$ for controlling the variable gain controller 13C1, 13C2 and 13C3 of the digital predistorter 13 based on the levels detected by the level detectors 21BL, respectively; and phase controllers 21CP that generate odd-order distortion component phase control signals $C_{SP1}$, $C_{SP2}$ and $C_{SP3}$ for controlling the amounts of phase shift of the variable phase shifters 13B1, 13B2 and 13B3 of the digital predistorter 13 based on the phases detected by the phase detectors 21BP, respectively.

The configuration of the FIG. 8 embodiment is shown to deal with the third- to seventh-order distortion components, but the number of orders is arbitrary. The pilot signal extracted from the output of the power amplifier 16 is frequency-converted by the frequency converter 18 from the RF band to the baseband as referred to previously, and the baseband pilot signal is analog-digital converter (ADC) 19 from analog to digital signal, which is provided to the third-, fifth- and seventh-order distortion component extracting parts 21A1, 21A2 and 21A3. The odd-order distortion component extracting part 21A1, 21A2 and 21A3 are formed by filters (distortion component extracting band-pass filters BPF) corresponding to the frequencies of respective odd-order distortion components so as to extract third-, fifth- and seventh-order distortion components of the pilot signal from the converted digital signal, respectively. The extracted odd-order distortion components are provided to the distortion component detectors 21B1, 21B2, 21B3 and the amplitude/phase controllers 21C1, 21C2, 21C3, which control the corresponding odd-order vector adjusters (the variable phase shifters 13B1, 13B2, 13B3 and the variable gain adjusters 13C1, 13C2, 13C3) of the digital predistorter 13.

Each level detector 21BL is an envelope detector or power amplifier formed by a diode. The amplitude components of respective odd-order distortion components are detected by such level detectors. Each phase detector 21BP is composed of a limiter and a phase comparator. An input signal to the phase detector 21BP is rendered by the limiter into a square wave. The position of rise or fall of the square wave is compared with the phase set in the phase comparator to detect the phase of the square wave. The level detector 21BL and the phase detector 21BP may be formed by a quadrature demodulator. A control signal can also be obtained by numerical computation of amplitude and phase components of a signal produced by quadrature-detection of the distortion component.

Figure 9:
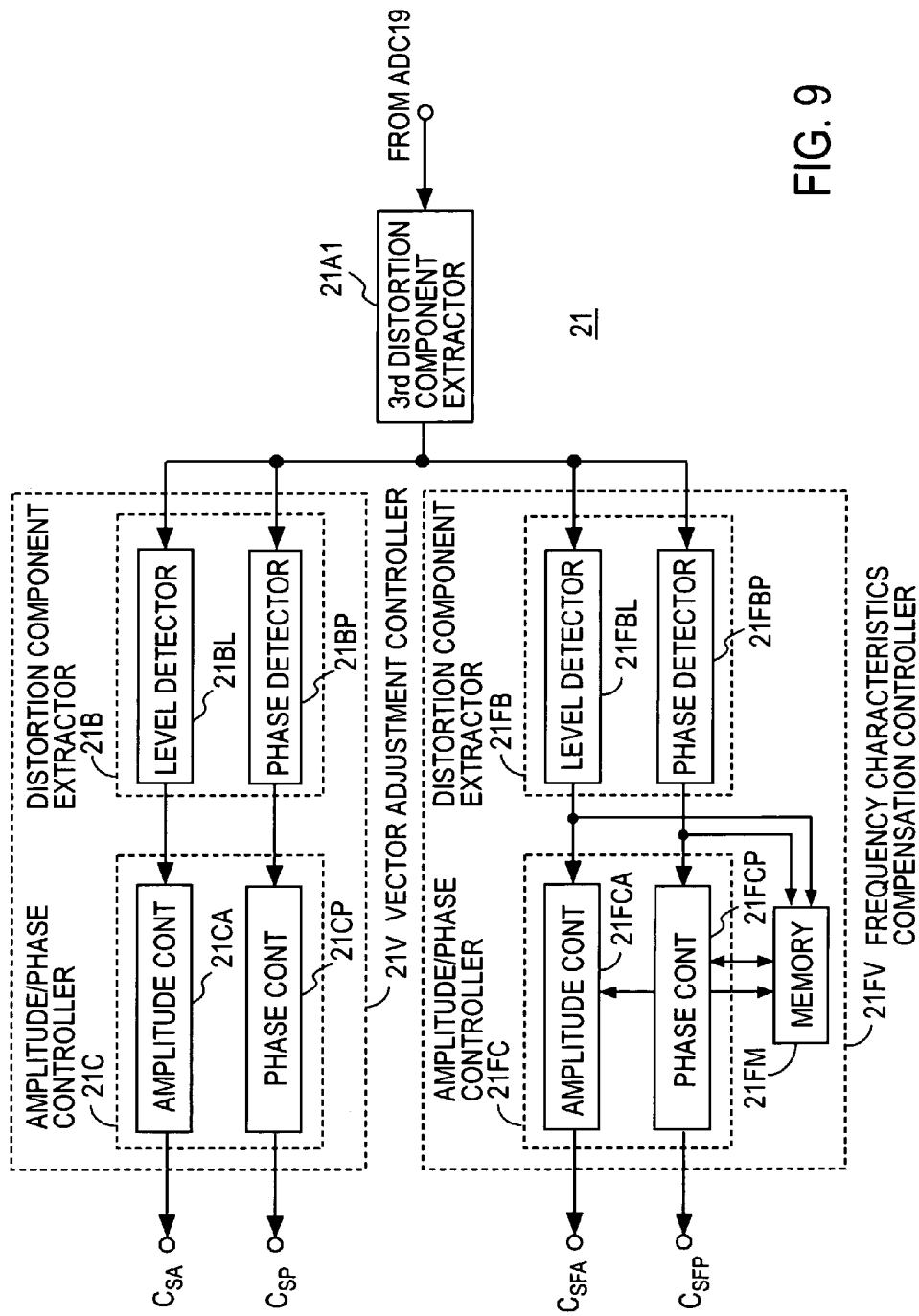
FIG. 9 is a block diagram showing another example of the control part for use in the high-efficiency linear power amplifier according to the present invention.

FIG. 9 illustrates in block form an example of the control part 21 for the digital predistorter 13 provided with the frequency characteristic compensators 13F1, 13F2, 13F3 or 13G1, 13G2, 13G3 as depicted in FIGS. 5A, 6 and 7. This example shows only control for the third-order distortion component. The pilot signal extracted by the pilot signal extractor 17, then down converted by the frequency converter 18 to the baseband, and converted by ADC 19 to digital form in FIGS. 3 and 4, is provided to the third-order distortion component extracting part 21A1 to thereby extract the third-order distortion component of the pilot signal. As is the case with the FIG. 8 embodiment, the level and phase of the extracted third-order distortion component are detected by the distortion component detector 21B of a vector adjustment controller 21V, and the thus detected level and phase are used to generate the third-order distortion component amplitude control signal $C_{SA}$ and the third-order distortion component phase control signal $C_{SP}$ by the amplitude/phase controller 21C.

To control the frequency characteristic compensators 13F1, 13F2, 13F3 (and 13G1, 13G2, 13G3), it is necessary to sweep the frequency of the pilot signal $S_P$ in a predetermined frequency band (in the frequency band of the transmission signal). The amplitude and phase of each odd-order distortion component of the pilot signal $S_P$ at each point of its frequency swept at predetermined frequency intervals are detected by a level detector 21FBL and a phase detector 21FBP of a distortion component detector 21FB. The detected amplitude and phase are stored in a memory 21FM associated with the control part 21. The memory 21FM stores amplitude and phase values corresponding to the swept frequency points. The stored numerical values are used by an amplitude controller 21FCA and a phase controller 21FCP of an amplitude/phase controller 21FG to control the parameters of the frequency characteristic compensators 13F1, 13F2, 13F3 (and 13G1, 13G2, 13G3) of the digital predistorter 13 so that the frequency characteristic of the intermodulation distortion by the power amplifier 16 becomes flat.

Third-Order Distortion Component Extracting Part

Figure 10:
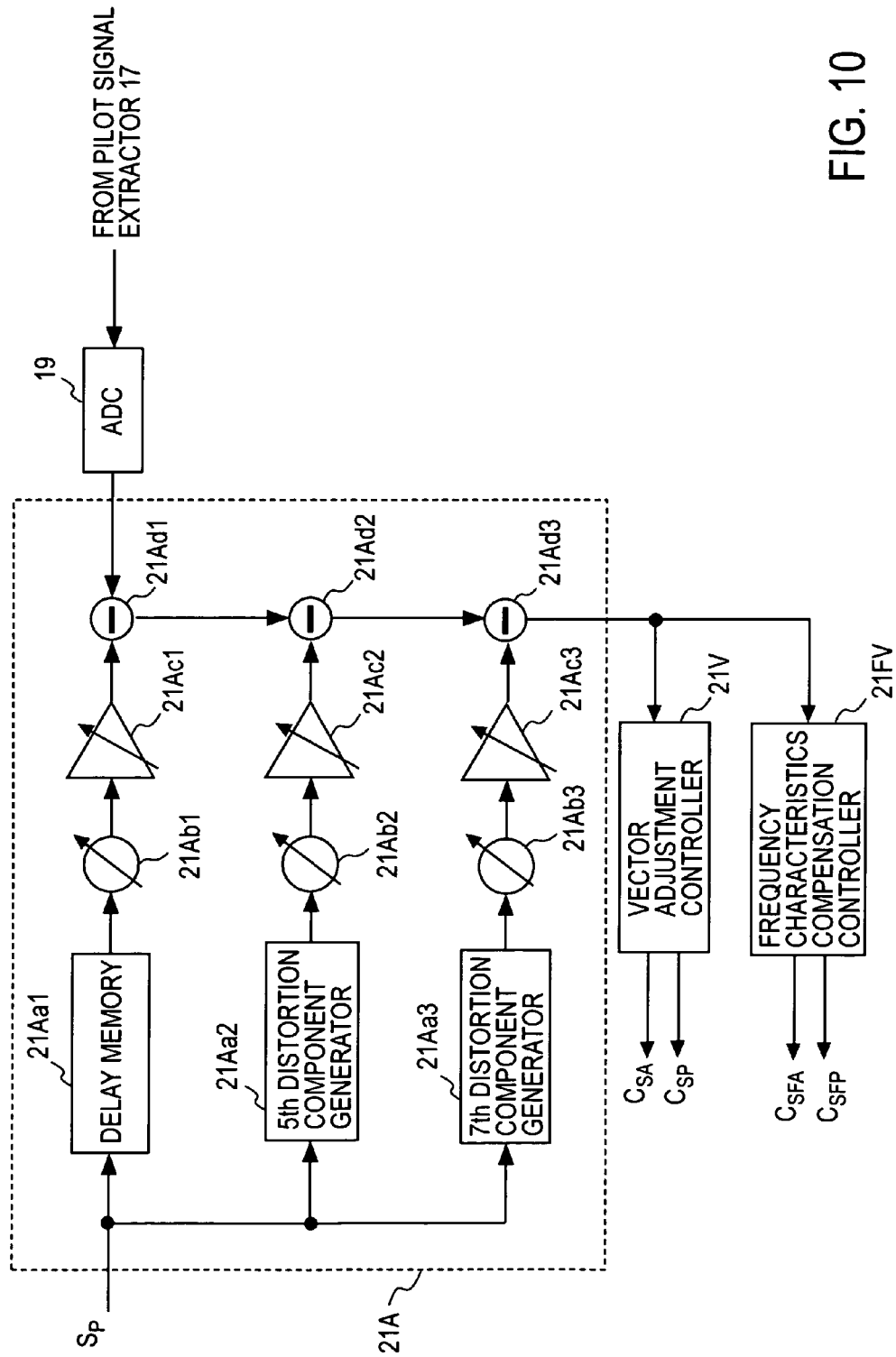
FIG. 10 is a block diagram depicting an example of a third order distortion component extracting part 21A in FIG. 9.

FIG. 10 illustrates in block form an example of the third-order distortion component extracting part 21A1 in FIGS. 8 and 9. The output RF signal from the power amplifier 16 contains a plurality of odd-order distortion components of the pilot signal. The illustrated example does not use a band-pass filter to extract the third-order distortion component, but instead it is configured to extract the third-order distortion component by subtracting the pilot signal $S_P$ generated by the pilot signal generator 11 and its fifth- and seventh-order distortion components from the extracted pilot signal fed from the analog-digital converter 19.

The pilot signal $S_P$ from the pilot signal generator 11 is applied via a delay memory 21Aa1 forming a linear path to a variable phase shifter 21Ab1, wherein it is phase-adjusted, and the phase-adjusted pilot signal is amplitude-adjusted by a variable gain adjuster 21Ac1 and then applied therefrom to a subtractor 21Ad1. The subtractor 21Ad1 subtracts the pilot signal from the extracted pilot signal from the analog-digital converter 19 which contains distortion components. The pilot signal $S_P$ is also applied to fifth- and seventh-order distortion component generators 21Aa2 and 21Aa3, by which fifth- and seventh-order distortion components of the pilot signal are generated. The distortion components are phase-adjusted by variable phase shifters 21Ab2 and 21Ab3, then amplitude-adjusted by variable gain adjusters 21Ac2 and 21Ac3, and fed to subtractors 21Ad2 and 21Ad3. The fifth- and seventh-order distortion components are sequentially subtracted from the output from the subtractor 21Ad1 to thereby extract the third-order distortion component.

The thus extracted third-order distortion component is provided, for example, as shown in FIG. 9, to the vector adjustment controller 21V and a frequency characteristic compensation controller 21FV, by which are generated the amplitude control signal $C_{SA}$, the phase control signal $C_{SP}$ and the third-order distortion component frequency characteristic compensating amplitude control signal $C_{SF4}$, the third-order distortion component frequency characteristic compensating phase control signal $C_{SFP}$. The fifth- and seventh-order distortion component extracting parts 21A2 and 21A3 in FIG. 8 can also be similarly configured.

In this way, a desired odd-order distortion component of the pilot signal can be extracted when other odd-order distortion components are superimposed on the desired one.

EFFECT OF THE INVENTION

As described above, according to the high-efficiency linear power amplifier of the present invention, the digital predistorter 13 based on a power-series model predistorts the transmission signal in such a manner as to compensate for the intermodulation distortion that is produced by the Doherty power amplifier 16. The distortion component by the power-series model is represented as a linear sum of odd-order distortion components. On this account, direct extraction of the respective odd-order distortion components from the pilot signal enables the distortion components to be suppressed with higher efficiency than by the Cartesian feedback control scheme and the lookup table type digital predistorter. The pilot signal has a sufficiently narrower band than the transmission signal like a tone signal. Accordingly, a sufficient response time can be set for negative feedback control.

The compression of the output backoff of the Doherty amplifier 16 provides increased efficiency of a power amplifier even in a modulation system of large crest factor. The nonlinearity in this operating region is compensated for by the digital predistorter. In various linearizing circuits the predistorter configuration permits high-efficiency operation of the power amplifier as compared with the feedforward configuration. The combined use of the Doherty amplifier and the digital predistorter multiplies their effects.

Accordingly, the present invention has advantages of:

(1) Offering simple-structured amplifier capable of high-efficiency amplification and linear amplification; and (2) Achieving miniaturization of the transmitter by reducing power consumption.

What is claimed is:

1. A high-efficiency linear power amplifier comprising:
a digital predistorter for predistorting an input digital transmission signal thereto by use of a power-series model;
a digital-analog converter for converting the output from said digital predistorter to an analog signal;
an up converting part for frequency-converting the output from said digital-analog converter to a radio-frequency signal;
a Doherty amplifier for power-amplifying said radio-frequency signal and for transmitting said power-amplified radio-frequency signal;
a pilot signal generator for generating a digital pilot signal;
an adder for adding said digital pilot signal to said digital transmission signal and for inputting the added output to said digital predistorter;
a pilot signal extractor for extracting a radio-frequency pilot signal from the output from said Doherty amplifier;
a down converting part for frequency-converting said extracted pilot signal to a baseband extracted pilot signal;
an analog-digital converter for converting said baseband extracted pilot signal to a digital extracted pilot signal; and
a control part for detecting an odd-order distortion component from said digital extracted pilot signal and for controlling parameters of said digital predistorter based on the detected odd-order distortion component.

2. A high-efficiency linear power amplifier comprising:
a digital predistorter for predistorting an input digital transmission signal thereto by use of a power-series model;
a digital-analog converter for converting the output from said digital predistorter to an analog signal;
an up converting part for frequency-converting the output from said digital-analog converter to a radio-frequency signal; and
a Doherty amplifier for power-amplifying said radio-frequency signal and for transmitting said power-amplified radio-frequency signal;
a pilot signal generator for generating a digital pilot signal;
another digital predistorter for predistorting said digital pilot signal by use of a power-series model to provide a pilot signal added with an odd-order distortion component;
another digital-analog converter for converting said pilot signal added with the odd-order distortion component to an analog pilot signal;
an adder for adding together said analog signal from said digital-analog converter and said analog pilot signal from said another digital-analog converter and for applying the added output as an input signal to said up converting part;
a pilot signal extractor for extracting a radio-frequency pilot signal from the output from said Doherty amplifier;
a down converting part for frequency-converting said extracted pilot signal to a baseband extracted pilot signal;
an analog-digital converter for converting said baseband extracted pilot signal to a digital extracted pilot signal; and
a control part for detecting an odd-order distortion component from said digital extracted pilot signal and for controlling parameters of said digital predistorter and said another digital predistorter based on the detected odd-order distortion components.

3. The high-efficiency linear power amplifier of claim 1 or 2, wherein said digital predistorter comprises:
a linear path for linear transfer of an input signal;
a nonlinear path for imparting an odd-order distortion to said input signal;
a delay memory inserted in said linear path, for providing the same delay as in said nonlinear path;
an odd-order distortion generator inserted in said nonlinear path, for generating an odd-order distortion component of said input signal; and
a vector adjuster inserted in said nonlinear path, for adjusting the amplitude and phase of said odd-order distortion component.

4. The high-efficiency linear power amplifier of claim 1 or 2, wherein said digital predistorter comprises:
a linear path for linear transfer of an input signal;
a nonlinear path for imparting an odd-order distortion to said input signal;
a delay memory inserted in said linear path, for providing the same delay as in said nonlinear path;
an odd-order distortion generator inserted in said nonlinear path, for generating an odd-order distortion component of said input signal; and
a vector adjuster inserted in said nonlinear path, for adjusting the amplitude and phase of said odd-order distortion component; and wherein said control part comprises;
an odd-order distortion component extracting part for extracting the odd-order distortion component from said extracted pilot signal;
a distortion component detector for detecting the level and phase of said extracted odd-order distortion component; and
an amplitude/phase controller for controlling said vector adjuster inserted in said nonlinear path of said digital predistorter based on the detected level and phase.

5. The high-efficiency linear power amplifier of claim 1 or 2, wherein said Doherty power amplifier comprises: a peak amplifier that performs a class "C" operation when the amplitude of an input signal is above a predetermined threshold value; and a carrier amplifier that performs a class "B" operation at all times.

6. The high-efficiency linear power amplifier of claim 3, further comprising a frequency characteristic compensator inserted in said nonlinear path at at least one of input and output sides of said odd-order distortion generator, for imparting a frequency characteristic to said input signal to compensate for the frequency characteristic of a distortion produced by said Doherty power amplifier.

7. The high-efficiency linear power amplifier of claim 6, wherein said frequency characteristic compensator is an FIR filter.

8. The high-efficiency linear power amplifier of claim 6, wherein said frequency characteristic compensator comprises:
a fast Fourier transformer for transforming said input signal to a frequency domain signal;
another vector adjuster for adjusting the amplitude and phase of said frequency domain signal; and
an inverse fast Fourier transformer for transforming said adjusted frequency domain signal to a time domain signal and for providing said time domain signal as the output from said frequency characteristic compensator.

9. The high-efficiency linear power amplifier of claim 4, wherein said odd-order distortion component extracting part is a band-pass filter that permits the passage therethrough of the frequency of said odd-order distortion component.

10. The high-efficiency linear power amplifier of claim 4, wherein said odd-order distortion component extracting part comprises:
a linear path for transmitting said digital pilot signal with a predetermined delay;
an odd-order distortion component generator for generating an odd-order distortion component different from said odd-order distortion component of said digital pilot signal;
a nonlinear path having inserted therein a variable phase shifter and a variable gain adjuster for adjusting the phase and gain of said odd-order distortion component; and
subtracting means for subtracting the outputs from said linear path and said nonlinear path from said digital extracted pilot signal provided from said analog-digital converter to extract said odd-order distortion component.

* * * * *

UNITED STATES PATENT AND TRADEMARK OFFICE
CERTIFICATE OF CORRECTION

PATENT NO. : 7,042,283 B2
APPLICATION NO. : 10/806245
DATED : May 9, 2006
INVENTOR(S) : Suzuki et al.

It is certified that error appears in the above-identified patent and that said Letters Patent is hereby corrected as shown below:

On the title page, Item (73), the Assignee information is incorrect. Item (73) should read:

-- (73) Assignee: NTT DoCoMo, Inc., Tokyo (JP) --

Signed and Sealed this

Twenty-second Day of August, 2006

JON W. DUDAS
*Director of the United States Patent and Trademark Office*